(12) United States Patent
Morohashi (10) Patent No.: US 7,877,065 B2
(45) Date of Patent: Jan. 25, 2011

(54) SIGNAL PROCESSING CIRCUIT AND COMMUNICATION DEVICE USING THE SAME

(75) Inventor: Hideo Morohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 602 days.

(21) Appl. No.: 11/325,670

(22) Filed: Jan. 4, 2006

(65) Prior Publication Data

US 2006/0170496 A1    Aug. 3, 2006

(30) Foreign Application Priority Data

Jan. 5, 2005    (JP) .............................. 2005-000560

(51) Int. Cl.
*H01Q 11/12*    (2006.01)
*H04B 1/04*    (2006.01)

(52) U.S. Cl. ..................... 455/118; 455/127.3; 455/326; 455/315; 455/93; 455/111; 455/112

(58) Field of Classification Search ................. 455/118, 455/313–333, 127.3, 93, 110–113
See application file for complete search history.

(56) References Cited

U.S. PATENT DOCUMENTS

| | | | | | |
|---|---|---|---|---|---|
| 3,974,460 | A | * | 8/1976 | Hongu et al. ................ | 332/152 |
| 5,323,123 | A | * | 6/1994 | Philippe ...................... | 330/277 |
| 5,515,014 | A | * | 5/1996 | Troutman .................... | 332/178 |
| 5,884,154 | A | * | 3/1999 | Sano et al. ................... | 455/321 |
| 5,926,749 | A | * | 7/1999 | Igarashi et al. ............. | 455/127.2 |
| 6,026,286 | A | * | 2/2000 | Long ........................... | 455/327 |
| 6,040,731 | A | * | 3/2000 | Chen et al. .................. | 327/359 |
| 6,163,198 | A | * | 12/2000 | Cargill ........................ | 327/350 |
| 6,205,325 | B1 | * | 3/2001 | Groe ........................... | 455/333 |
| 6,300,845 | B1 | * | 10/2001 | Zou ............................. | 332/178 |
| 6,333,675 | B1 | * | 12/2001 | Saito ........................... | 330/133 |
| 6,347,221 | B1 | | 2/2002 | Tsukahara | |
| 6,373,345 | B1 | * | 4/2002 | Kimppa et al. ............. | 332/105 |
| 6,404,263 | B1 | * | 6/2002 | Wang .......................... | 327/359 |
| 6,477,360 | B1 | * | 11/2002 | Watanabe et al. ........... | 455/318 |
| 6,525,606 | B1 | * | 2/2003 | Atkinson ..................... | 330/133 |

(Continued)

FOREIGN PATENT DOCUMENTS

JP    2 134908    5/1990

(Continued)

*Primary Examiner*—Edward Urban
*Assistant Examiner*—RuiMeng Hu
(74) *Attorney, Agent, or Firm*—Frommer Lawrence & Haug LLP; William S. Frommer; Thomas F. Presson (57) ABSTRACT

A signal processing circuit having a modulator having frequency conversion circuits, each having a local oscillator and a mixer. The circuit multiplies a signal having a first frequency and a local oscillation signal from the local oscillator at the mixer to convert the frequency of the first frequency signal to a second frequency, outputs a current format frequency converted signal and a first gain control circuit amplifying the current format frequency converted signals from the frequency conversion circuits by a first gain in accordance with a first control voltage. The circuit also outputs the current format amplified signals and a second gain control circuit connected after the first gain control circuit and having at least one gain control circuit which amplifies a current format amplified signal output from the first gain control circuit by a second gain.

14 Claims, 9 Drawing Sheets

U.S. PATENT DOCUMENTS

| | | | |
|---|---|---|---|
| 6,559,692 B2* | 5/2003 | Kimball et al. ............. 327/109 |
| 6,563,375 B1 | 5/2003 | Khosrowbeygi et al. |
| 6,675,000 B1* | 1/2004 | Ichikawa ................. 455/127.3 |
| 6,728,224 B1* | 4/2004 | Kakizaki et al. ............ 370/313 |
| 6,788,744 B1* | 9/2004 | Hirama ....................... 375/297 |
| 6,850,746 B1* | 2/2005 | Lloyd et al. ................. 455/272 |
| 6,959,178 B2* | 10/2005 | Macedo et al. ............. 455/313 |
| 7,027,783 B2* | 4/2006 | Vilhonen et al. ........... 455/118 |
| 7,098,732 B2* | 8/2006 | Dupuie ....................... 330/133 |
| 7,103,327 B2* | 9/2006 | Pan ............................. 455/102 |
| 7,107,025 B2* | 9/2006 | Khorram .................... 455/118 |
| 7,116,949 B2* | 10/2006 | Irie et al. .................... 455/118 |
| 7,123,899 B1* | 10/2006 | Chen et al. .................. 455/341 |
| 7,145,389 B2* | 12/2006 | Yang et al. .................. 330/256 |
| 7,187,909 B2* | 3/2007 | Lin et al. ....................... 455/91 |
| 7,193,466 B2* | 3/2007 | Kim et al. ................... 330/258 |
| 7,277,689 B2* | 10/2007 | Simon ........................ 455/323 |
| 7,280,815 B2* | 10/2007 | Pellat et al. ................. 455/326 |
| 7,324,799 B2* | 1/2008 | Vaara .......................... 455/334 |
| 7,333,565 B2* | 2/2008 | Oono et al. ................. 375/307 |
| 7,383,034 B2* | 6/2008 | Shima et al. ................ 455/326 |
| 7,405,608 B2* | 7/2008 | Filoramo et al. ........... 327/359 |
| 7,750,749 B2* | 7/2010 | Jones ......................... 332/105 |
| 2001/0014596 A1* | 8/2001 | Takaki et al. ............... 455/324 |
| 2001/0018334 A1* | 8/2001 | Ipek et al. ................... 455/318 |
| 2002/0193089 A1* | 12/2002 | Hatcher et al. ............. 455/326 |
| 2003/0078016 A1* | 4/2003 | Groe et al. .................... 455/91 |
| 2003/0114129 A1* | 6/2003 | Jerng ......................... 455/323 |
| 2003/0119474 A1* | 6/2003 | Kimura ...................... 455/333 |
| 2003/0184378 A1* | 10/2003 | Segawa ...................... 330/254 |
| 2004/0002315 A1* | 1/2004 | Lin ............................. 455/255 |
| 2004/0092236 A1* | 5/2004 | Irie et al. .................... 455/118 |
| 2004/0137862 A1* | 7/2004 | Tanaka et al. ............. 455/127.3 |
| 2004/0176052 A1* | 9/2004 | Vilhonen et al. ......... 455/127.1 |
| 2004/0203553 A1* | 10/2004 | Toyota et al. ............... 455/333 |
| 2004/0214533 A1* | 10/2004 | Khorram .................... 455/118 |
| 2004/0224658 A1* | 11/2004 | Borremans .................. 455/323 |
| 2004/0229589 A1* | 11/2004 | Behzad ....................... 455/285 |
| 2004/0229592 A1* | 11/2004 | Matsui et al. ............... 455/333 |
| 2004/0246051 A1* | 12/2004 | Hsu et al. .................... 330/252 |
| 2004/0253936 A1* | 12/2004 | Simon ........................ 455/323 |
| 2005/0014476 A1* | 1/2005 | Oono et al. ................. 455/118 |
| 2005/0032489 A1* | 2/2005 | Boos ......................... 455/127.3 |
| 2005/0130619 A1* | 6/2005 | Hanke et al. ............... 455/326 |
| 2005/0191976 A1* | 9/2005 | Shakeshaft et al. .......... 455/118 |
| 2006/0052071 A1* | 3/2006 | Pan .......................... 455/127.3 |
| 2006/0066397 A1* | 3/2006 | Dupuie ....................... 330/133 |
| 2007/0021076 A1* | 1/2007 | Tanaka et al. ............... 455/118 |

FOREIGN PATENT DOCUMENTS

| | | |
|---|---|---|
| JP | 5 57917 | 7/1993 |
| JP | 8 186452 | 7/1996 |
| JP | 2000 13159 | 1/2000 |
| JP | 2000 91915 | 3/2000 |
| JP | 2000 196386 | 7/2000 |
| JP | 2003 87067 | 3/2003 |
| JP | 2003 229735 | 8/2003 |
| JP | 2004 512724 | 4/2004 |

* cited by examiner

SIGNAL PROCESSING CIRCUIT AND COMMUNICATION DEVICE USING THE SAME

CROSS REFERENCES TO RELATED APPLICATIONS

The present invention contains subject matter related to Japanese Patent Application No. 2005-000560 filed in the Japan Patent Office on Jan. 5, 2005, the entire contents of which being incorporated herein by reference.

BACKGROUND OF THE INVENTION

1. Field of Invention

The present invention relates to a signal processing circuit, for example, a quadrature modulator in a mobile communication apparatus etc. and a gain controlled type amplifier (GCA) connected to the same for gain control. The present invention further relates to a communication apparatus using such a signal processing circuit.

2. Description of the Related Art

Japanese Patent Publication (A) No. 11-136051 and Japanese Patent Publication (A) No. 8-223233 disclose communication apparatuses having transmission circuits modulating and amplifying the base band (BB) signal of a code division multiple access (CDMA) type mobile phone and emitting it from an antenna. The communication apparatus 200 illustrated in FIG. 7 has a modulation circuit 201 having an I- and Q-quadrature modulator 202 including a mixer and converting frequency and a plurality of gain controlled type amplifiers 203A to 203C, a surface acoustic wave (SAW) filter 205, a power amplifier 206, a duplexer 207, and an antenna (ANT) 208. The communication apparatus 200 converts in frequency a base band (BB) signal comprised of two orthogonal signals with phases in an orthogonal relationship, that is, an in-phase (I) signal and quadrature phase (Q-phase) signal to convert it into a high frequency (RF: radio frequency) signal able to be emitted from the antenna 208, amplifies it to a predetermined level, and emits it from the antenna 208 into the air. The BB terminal to which the base band (BB) signal is supplied is connected to the I- and Q-quadrature modulator (MOD) 202. The I- and Q-quadrature modulator 202 converts the base band signal to a 800 MHz or 2 GHz band RF signal. The output of the I- and Q-quadrature modulator 202 is connected to the GCA circuits (gain control amplifiers) 203A to 203C, and the RF signal output from the I- and Q-quadrature modulator 202 is amplified. For example, with one stage of the GCA circuits, there is a gain of about 30 dB. For the antenna (ANT) 208 to emit a signal, for example, a gain of about 80 dB is necessary, so three stages of GCA circuits 203A to 203C are provided. The amplified output of the GCA circuit 203C is connected to the SAW filter 205, the transmission signal is stripped of unnecessary high frequencies by selection of the frequency at the band pass filter of the SAW filter 205, and only the signal of the desired frequency band is output. The transmission signal output from the SAW filter 205 is amplified in power at the power amplifier 206, supplied through the next stage DUP (duplexer) 207 to the antenna 208, and emitted into the air.

Figure 7:
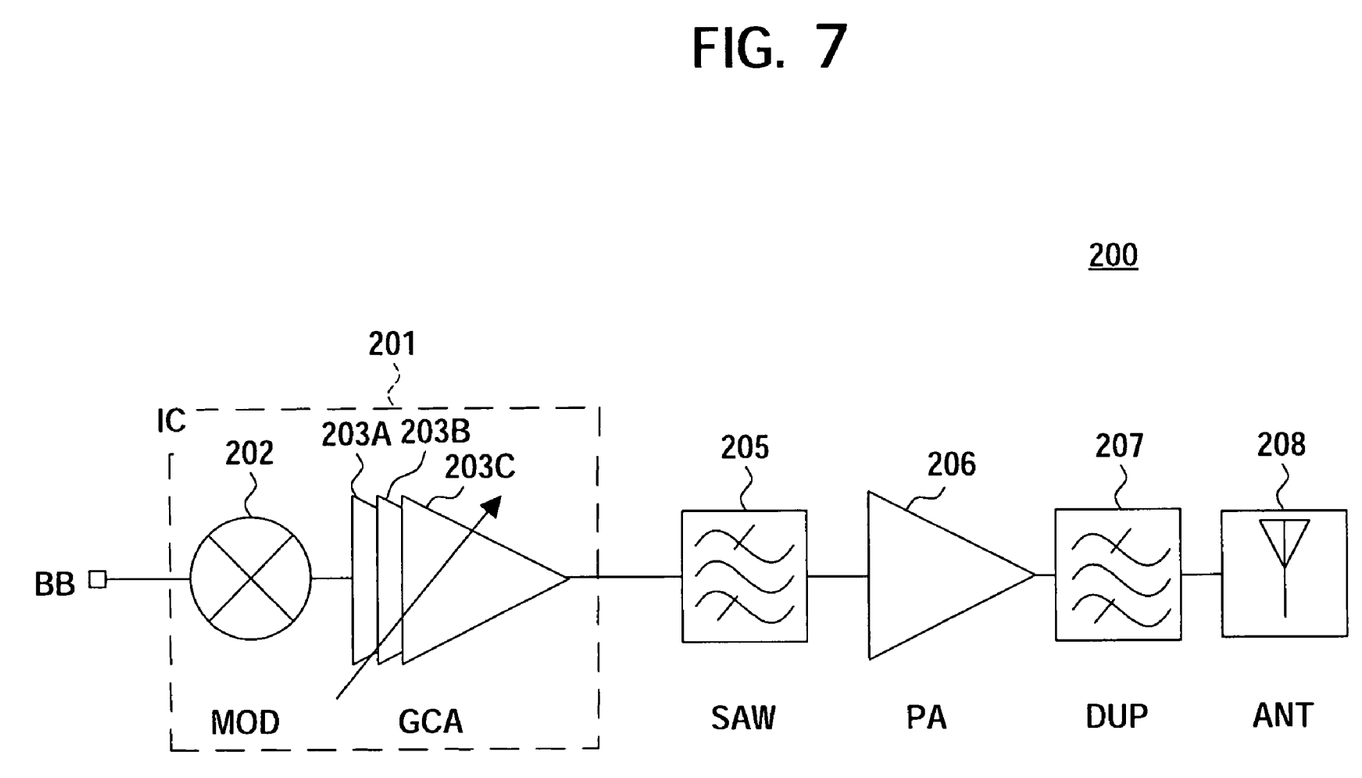
FIG. 7 is a view of the partial configuration of a communication apparatus having a transmission circuit modulating and amplifying a base band signal of a CDMA type mobile phone and emitting it from an antenna.

For example, in the case of a CDMA type mobile phone, a range of gain control with respect to the base band signal BB of about 80 dB or more is considered necessary. Further, good control linearity and temperature characteristics are demanded. Therefore, while there are the above three stages of more of gain controlled type amplifiers (GCA circuit), usually an I- and Q-quadrature modulator 202 does not control the gain of the frequency converted signal. That is, the gain control is performed by the plurality of gain control amplifiers 203A to 203C provided after the I- and Q-quadrature modulator 202. The plurality of gain controlled type amplifiers 203A to 203C 3 connected after the I- and Q-quadrature modulator 202 are configured as shown in FIG. 8.

Figure 8:
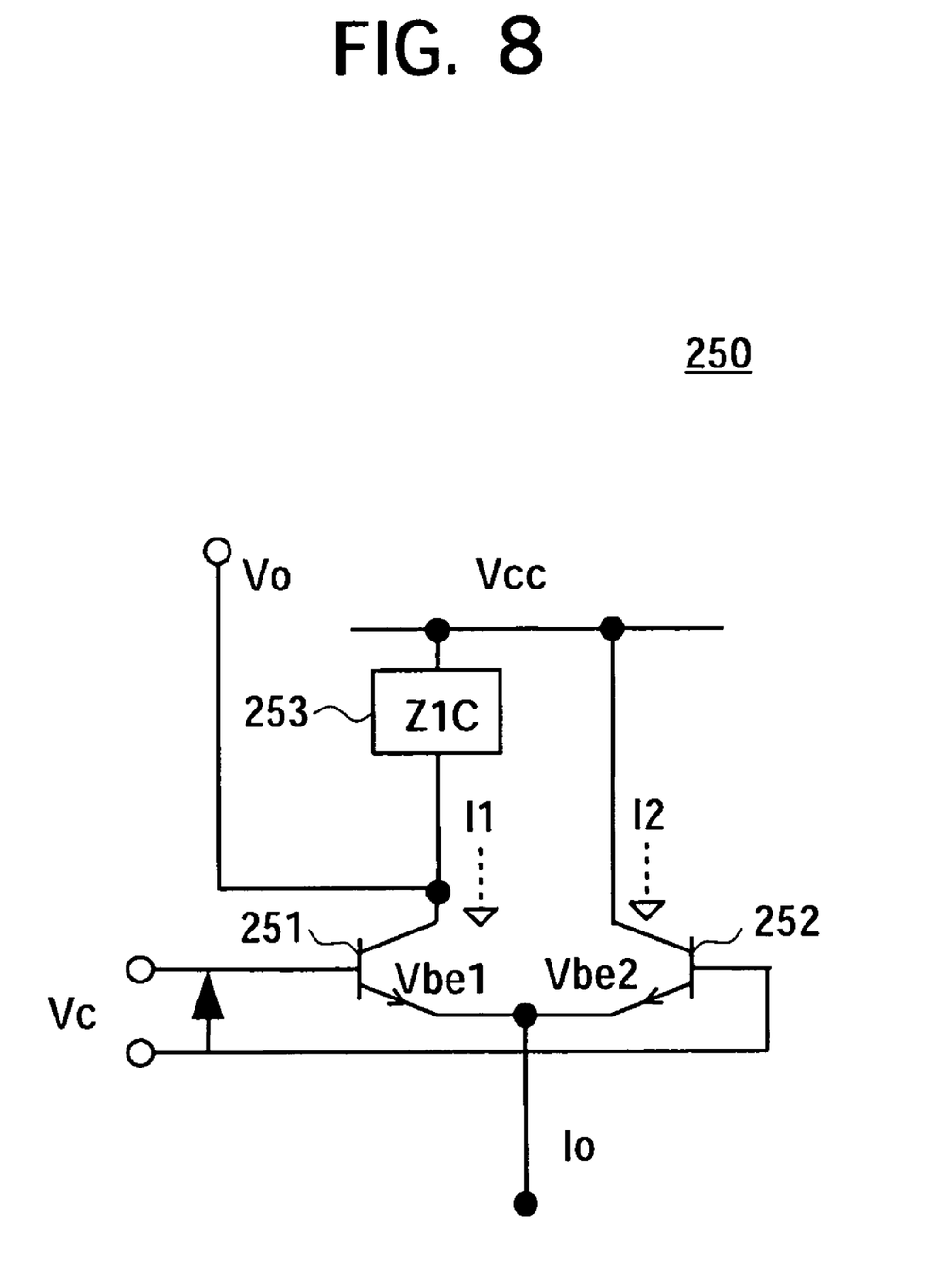
FIG. 8 is a circuit diagram of the circuit configuration of a gain controlled type amplifier shown in FIG. 7.

FIG. 8 shows the configuration of one circuit of the plurality of gain controlled type amplifiers 203A to 203C. The gain controlled type amplifier 250 shown in FIG. 8 is comprised as a differential pair type amplification circuit, an emitter of the NPN transistor 251 and an emitter of the NPN transistor 252 are commonly connected, a load Z1C is connected between a collector of the NPN transistor 251 and the supply line Vcc, and a collector of the NPN transistor 252 is connected to the supply line Vcc. A common emitter of the NPN transistors 251 and 252 is supplied with the output signal of the I- and Q-quadrature modulator 202 through for example a voltage-current conversion circuit etc. as a signal current I0. Further, the bases of the two transistors are supplied between them with a control voltage Vc for controlling the gain. The control voltage Vc controls the gain of the gain controlled type amplifier 250 and the signal current I0 and uses the gain to amplify the voltage. The amplified voltage is taken out as the output signal Vo from the collector of the NPN transistor 252.

The circuit operations of the gain controlled type amplifiers 203A to 203C will be explained next. In particular, the operation for showing the magnitude of the temperature fluctuation of the gain controlled type amplifiers 203A to 203C will be explained with reference to the GCA circuit 250 shown in FIG. 8. The output voltage Vo of the collector of the NPN transistor 251 of the GCA circuit 250 shown in FIG. 8 becomes as follows:

$$Vo = Z_1 \times I_1 \qquad (1)$$

The following relations stand:

$$V_{be1} = Vt \times \ln(I_1/Is) \qquad (2)$$

$$V_{be2} = Vt \times \ln(I_2/Is) \qquad (3)$$

where, Vt: thermal voltage $$Io = I_1 + I_2 \qquad (4)$$

From equations (2) and (3), the following equation (5) stands:

$$Vc = V_{be1} - V_{be2} = Vt \times \ln(I_1/I_2) \qquad (5)$$

From equation (5), equation (6) is obtained:

$$I_1 = I_2 \times \exp(Vc/Vt) \qquad (6)$$

If entering equation (6) into equation (4) to find $I_1$ and $I_2$, the following equations are obtained:

$$I_1 = Io/[1 + \exp(-Vc/Vt)] \qquad (7)$$

$$I_2 = Io/[1 + \exp(Vc/Vt)] \qquad (8)$$

If entering equation (7) into equation (1), the following equation is obtained:

$$Vo = Z_1 \times Io/[1 + \exp(-Vc/Vt)] \qquad (9)$$

If provisionally setting the input voltages Vi=1 and Z1=Io=1 so as to study the gain characteristics of the gain controlled type amplifier 250, the result becomes the gain G shown by equation (10):

$$G = Vo/Vi = 1/[1 + \exp(-Vc/Vt)] \qquad (10)$$

Figure 9:
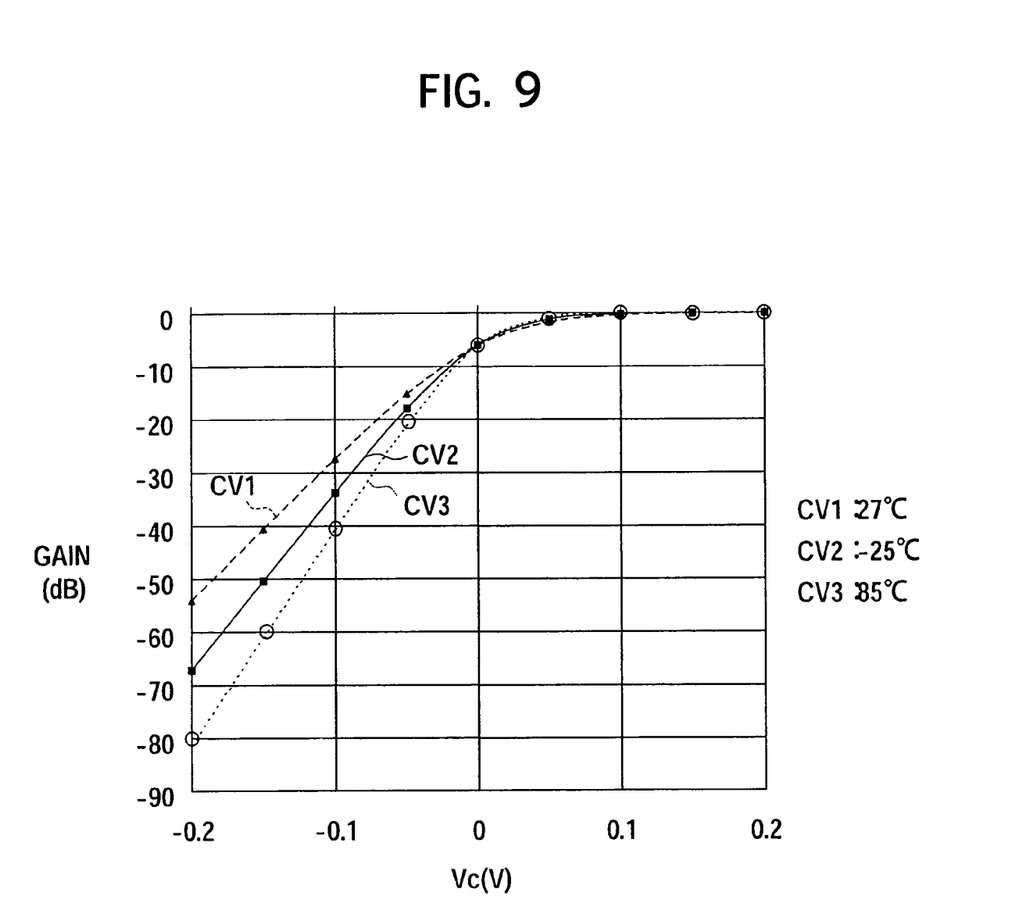
FIG. 9 is a graph of the attenuation characteristics of the gain controlled type amplifier shown in FIG. 8.

Regarding equation (10), if changing the ambient temperature and showing the relationship between the control voltage Vc and gain by a graph, the result becomes like FIG. 9. The abscissa shows the control voltage Vc from −0.2V to +0.2V in range in gradients of 0.1V steps, while the ordinate shows the gain in gradients of 10 dB steps from 0 dB to −90 dB in range. Further, the temperature conditions were set to the three conditions of 27° C., −25° C., and 85° C. When changing the control voltage Vc from +0.2V to +0.1V in range, the amount of attenuation is substantially 0 dB regardless of the temperature conditions. Even when the control voltage Vc is 0.1V to 0V in range, the attenuation characteristics are substantially the same, that is, about −6 dB at 0V. When the control voltage Vc becomes 0V or less, temperature dependency of the amount of attenuation appears. When the control voltage Vc is −0.1, the attenuation becomes about −27 dB at an ambient temperature of 85° C., about −34 dB at 27° C., and about −41 dB at −25° C. The difference becomes, at the maximum, 10 dB or more. This shows large fluctuation with respect to temperature. When the control voltage Vc becomes −0.2V, the attenuation becomes about −54 dB at 85° C., about −67 dB at 27° C., and about −82 dB at −25° C. The difference becomes, at the maximum, 25 dB or more. This shows larger fluctuation with respect to temperature. In this way, the GCA circuit 250 shown in FIG. 8 has points which should be improved in control linearity and temperature characteristics.

The plurality of gain controlled type amplifiers (GCAs) 203A to 203C in the modulation circuit 201 explained with reference to FIG. 7, FIG. 8, and FIG. 9 form a three-stage configuration, so the consumed current becomes larger. Further, since a three-stage configuration is employed, the number of elements increases and, in case of formation on an IC, the chip area occupied becomes larger and other problems arise. Further, if configuring the GCA circuit as shown in FIG. 8, there are problems in control linearity and temperature characteristics.

SUMMARY OF THE INVENTION

It is therefore desirable to provide a signal processing circuit which improves on the above related art.

According to the present invention, there is provided a signal processing circuit having: a modulator having frequency conversion circuits, each having a local oscillator and mixer, multiplying a signal having a first frequency and a local oscillation signal from the local oscillator at the mixer to convert the frequency of the first frequency signal to a second frequency, and outputting a current frequency converted signal and a first gain control circuit amplifying the current frequency converted signals from the frequency conversion circuits by a first gain in accordance with a first control voltage and outputting the current amplified signals and; a second gain control circuit connected after the first gain control circuit and having at least one gain control circuit amplifying a current amplified signal output from the first gain control circuit by a second gain in accordance with a second control voltage and outputting an amplified signal.

According to the present invention, further, there is provided a communication apparatus having the above signal processing circuit as a transmission circuit or a reception circuit connected to an antenna.

In the present invention, the modulator and part of the gain controlled type amplifiers (GCA circuits) are combined to form a circuit. The output signal of the modulator is not converted to voltage. Rather, the RF signal is transferred by current. Due to this, in the output part of the converter, an I-V conversion circuit for converting RF current to RF voltage, an emitter-follower circuit for shifting the level of the voltage, etc. become unnecessary and the consumed current can be reduced. Further, the area of the semiconductor chip can be reduced. Layout of the converter to the GCA circuit also becomes easy. Since the RF signal is supplied as a current signal to the GCA circuits, it is possible to avoid problems arising due to line capacitance and possible to improve the frequency characteristics. Further, the circuit configuration of a GCA circuit combined with a modulator and the new circuit configuration of the GCA circuits after that improve the linearity of the GCA circuits and the temperature characteristics.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Basic Circuit Configuration

Figure 1:
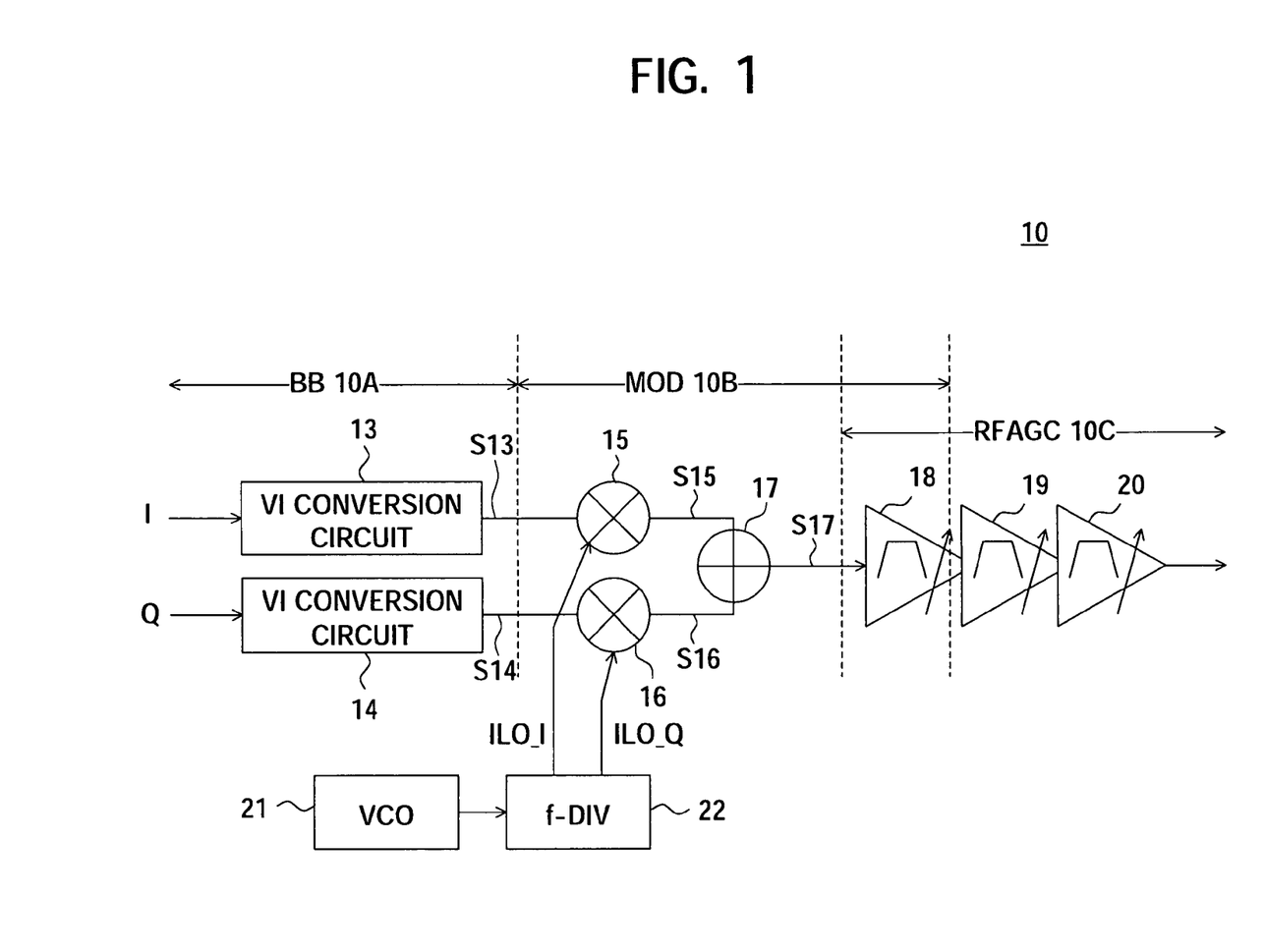
FIG. 1 is a view of the basic configuration of a gain control modulation circuit (gain control modulator) modulating and amplifying a base band signal as an embodiment of a modulator (modulation circuit) of the present invention.

FIG. 1 is a view of the basic configuration of a gain control modulation circuit (gain control modulator) modulating and amplifying a base band (BB) signal of an embodiment of a modulator (modulation circuit) as an example of a signal processing circuit of the present invention. The gain control modulation circuit (GCA) 10 shown in FIG. 1 corresponds to the modulation circuit 201 in the communication apparatus 200 illustrated in FIG. 7. It is of course also possible to use the GCA 10 illustrated in FIG. 1 explained later as an embodiment of the present invention in place of the modulation circuit 201 of the communication apparatus 200 of FIG. 7 and combine it with a SAW filter 205, power amplifier 206, and duplexer 207 to construct a communication apparatus 200 sending out a transmission signal from an antenna 208. Below, first, the gain control modulation circuit (GCA) 10 will be explained.

The V-I conversion unit 10. A has a first voltage-to-current (V-I) converter 13 to which the base band in-phase (I) component signal BB-I is supplied and a second voltage-to-current (V-I) converter 14 to which the base band quadrature phase (Q) component signal BB-Q is supplied. The V-I converter 13 converts the voltage signal, that is, the BB signal's I component signal, to a base band current signal. Note that the V-I converter 13 can also convert the voltage signal, that is, BB signal's I component signal, to a base band current signal and amplify it by a predetermined amplification rate and output a current signal. The V-I converter 14 is configured by the same circuits as the V-I converter 13 and converts the voltage signal, that is, the BB signal's Q component signal, to the base band current signal. Note that the V-I converter 14, like the V-I converter 13, can also convert the voltage signal, that is, BB signal's Q component signal, to a base band current signal and amplify it by a predetermined amplification rate and output a current signal.

The modulator (MOD) 10B has a first signal mixer 15, a second mixer 16, a high frequency (RF) signal combiner 17, a voltage controlled oscillator (VCO) 21, a frequency divider 22, and a gain controlled amplifier (GCA). The GCA 18 is arranged at the modulator (MOD) 10B, but also functions as the first amplification circuit of a RF-AGC processor 10C. The VCO 21 and the frequency divider 22 join to function as a local oscillation circuit (local oscillator). The VCO 21 functions as an oscillation circuit for outputting a signal of an oscillation frequency in accordance with the applied voltage. The frequency divider 22 divides the frequency of the signal output from the VCO 21 by a predetermined division ratio and outputs an in-phase (I) component local oscillation signal ILO-I and a quadrature phase (Q) component local oscillation signal ILO-Q the same as the I component local oscillation signal ILO-I in frequency, but shifted in phase by 90 degrees (phase shifted). The local oscillator configured by the VCO 21 and the frequency divider 22 outputs a signal having a frequency for converting to a predetermined transmission frequency the BB current signal of the I component and Q component output from the V-I converter 13 and V-I converter 14 in the first mixer 15 and second mixer 16. The first mixer 15 multiplies the current format I component BB signal S13 output from the V-I converter 13 and the I component local oscillation signal ILO-I output from the frequency divider 22 to convert to a high frequency (RF: radio frequency) I component signal S15 of the transmission frequency. Similarly, the second mixer 16 multiplies the current format Q component BB signal S14 output from the V-I converter 14 and the Q component local oscillation signal ILO-Q output from the frequency divider 22 to convert to a high frequency (RF) Q component signal S16 of the transmission frequency. That is, the first mixer 15 and the second mixer 16 are frequency conversion circuits for converting BB signals to RF signals.

The content of the frequency conversion will be explained later using equations.

Note that when the first mixer 15 and second mixer 16 are differential types, the I component local oscillation signal ILO-I is generated as a positive I component local oscillation signal +ILO-I and a negative I component local oscillation signal −ILO-I, while the Q component local oscillation signal ILO-Q is generated as a positive Q component local oscillation signal +ILO-Q and a negative Q component local oscillation signal −ILO-Q. As explained above in the background art, normally the signals output from the first mixer 15 and the second mixer 16 are voltage formats, but in the present embodiment, they are made the current format RF-I component signal S15 and the current format RF-Q component signal S16. The RF signal combiner 17 combines the current format RF-I component signal S15 and the current format RF-Q component signal S16 and applies the combined current format RF signal S17 to the GCA 18.

The GCA 18 is arranged at part of the modulator (MOD) 10B, but also functions as a first gain controlled type amplification circuit at the RF-AGC processor 10C, is controlled in gain by the control voltage Vc, and amplifies the current format RF signal S17 output from the RF signal combiner 17 by a gain controlled based on the control voltage Vc.

The RF-AGC processor 10C has a first gain control amplifier (GCA) 19 and a second GCA 20. The gain controlled type amplifier in the modulator 201 illustrated in FIG. 8 was a three-stage GCA (203A to 203C), but in the present embodiment, the first GCA is arranged as a GCA 18 in the MOD 10B, so only the two GCAs 19 and 20 are arranged inside the RF-AGC processor 10C. Note that in this embodiment as well, the gains of the GCA 18 and the GCAs 19 and 20 are made similar to the gains illustrated with reference to FIG. 8, for example, about 30 dB.

In this way, the present embodiment is characterized by the following configurations:

(1) The circuit configuration of the modulator 201 illustrated in FIG. 8 is comprised of a modulator (MOD) 10B consisting of a modulation circuit having a first frequency conversion circuit (VCO 21, frequency divider 22, and first mixer 15), a second frequency conversion circuit (VCO 21, frequency divider 22, and second mixer 16), and an RF signal combiner 17 combined with the first GCA 18 of the three-stage gain controlled type amplifiers.

(2) Further, the current format RF signal S17 is output from the RF signal combiner 17 to the GCA 18. The signal amplified at the GCA 18 is applied in the current format to the first gain controlled type amplifier (GCA) 19.

By configuring the modulator (MOD) 10B in the above-mentioned way, the following effects are obtained:

(1) The I-V conversion circuit for converting RF current to RF voltage as the output signal from the MOD 10B, the emitter follower circuit for shifting the level of the voltage, etc. become unnecessary. As a result, the consumed current at the MOD 10B can be reduced. Further, the area on the semiconductor chip forming the MOD 10B can be reduced. Further, the layout in the MOD 10B becomes easy.

(2) Since the signal in the MOD 10B is an RF current signal and since the RF current signal is applied to the GCA 18, the occurrence of signal degradation and other problems arising due to the electrostatic capacity in the MOD 10B and in the signal path from the RF signal combiner 17 to the GCA 18 can be avoided and the frequency characteristics can be improved.

(3) The signal output from the GCA 18 to the first GCA 19 is also a current format. Of course, the signal output from the first GCA 19 to the second GCA 20 is also a current format. As a result, the linearity and the temperature characteristics are improved in the overall gain controlled type amplification circuit comprised of the GCA 18, first GCA 19, and second GCA 20 combined.

First Embodiment

Figure 2:
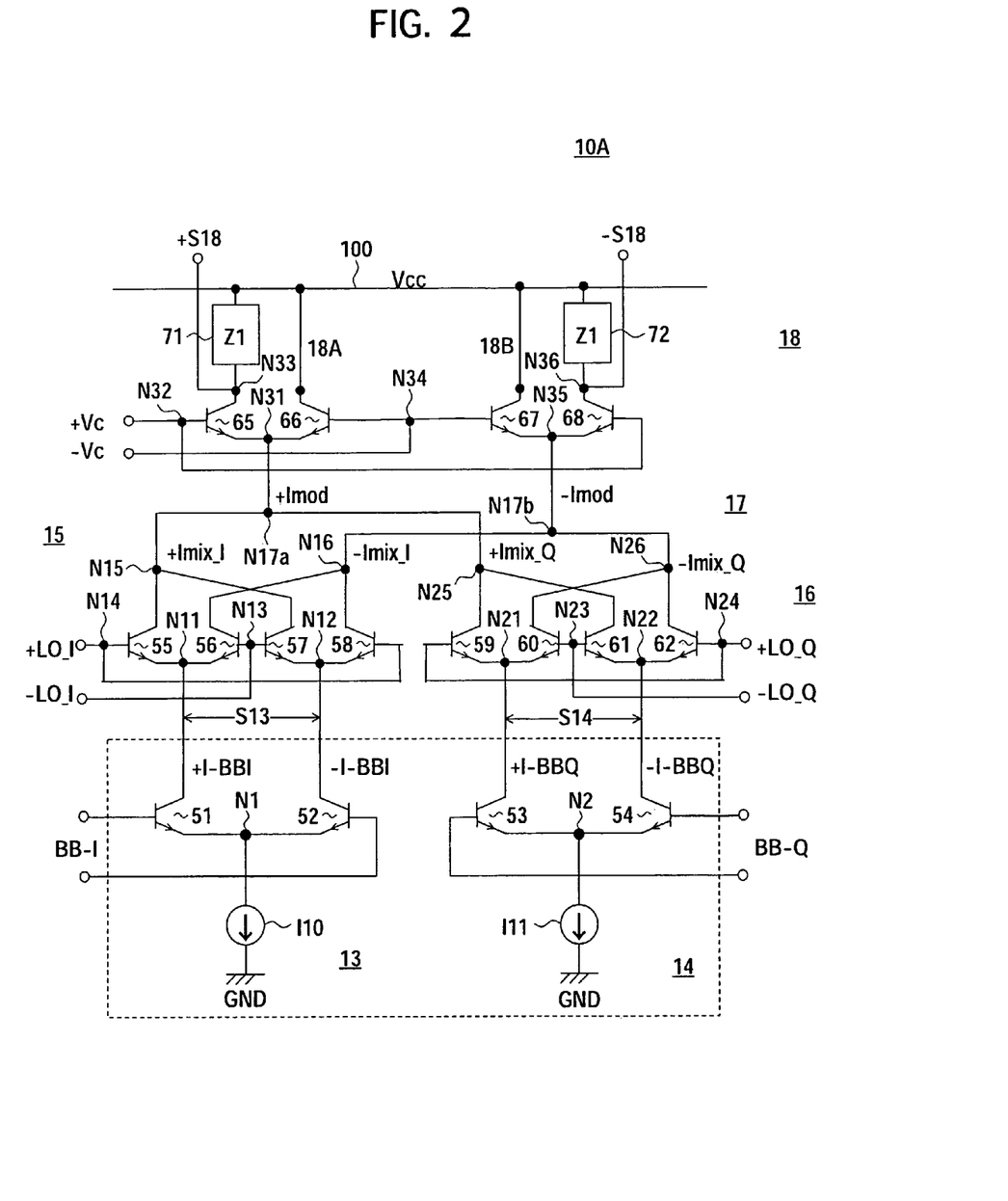
FIG. 2 is a view illustrating an example of a circuit of a first embodiment of a V-I conversion unit and modulator in the gain control modulation circuit shown in FIG. 1.

FIG. 2 is a view of an example of a circuit as a first embodiment of the voltage-to-current (V-I) conversion unit 10A and modulator (MOD) 10B in the gain control modulation circuit (GCA) 10 shown in FIG. 1.

Circuit Configuration of Voltage-to-Current (V-I) Conversion Unit 10A

V-I Converter 13

The V-I converter 13 for converting the voltage format base band I component signal BB-I to the current format I component BB signal S13 is comprised of two NPN transistors 51 and 52 and first constant current source I10 forming a differential amplification circuit. An emitter of the NPN transistor 51 and an emitter of the NPN transistor 52 are commonly connected at a node N1, while the node N1 is connected through a constant current source I10 to the ground (ground potential portion) as a second reference potential. The bases of the NPN transistor 51 and the NPN transistor 52 are supplied between them with the voltage format base band I component signal BB-I. Collectors of the NPN transistor 51 and the NPN transistor 52 are connected as terminals for outputting the I component BB signal S13 comprised of the current format differential signals +BB-I and −BB-I to the common connection point (node) N11 of the emitters of the transistors 55 and 56 forming the first mixer 15 and the common connection point (node) N12 of the emitters of the transistors 57 and 58.

V-I Converter 14

The V-I converter 14 for converting the voltage format base band Q component signal BB-Q to the current format Q component BB signal S14 is configured circuit-wise in the same way as the V-I converter 13. That is, the V-I converter 14 is also comprised of two NPN transistors 53 and 54 and a second constant current source I11 forming a differential amplification circuit. An emitter of the NPN transistor 53 and an emitter of the NPN transistor 54 are commonly connected to a node N2, while the node N2 is connected through a constant current source I11 to the ground. The bases of the NPN transistor 53 and the NPN transistor 54 are supplied between them with the voltage format base band Q component signal BB-Q. Collectors of the NPN transistor 53 and the NPN transistor 54 are connected as terminals for outputting the Q component BB signal S14 comprised of the current format differential signals +BB-Q and −BB-Q to the common connection point (node) N21 of the emitters of the transistors 59 and 60 forming the second mixer 16 and the common connection point (node) N22 of the emitters of the transistors 61 and 62. The V-I converter 13 and V-I converter 14 are comprised of differential amplifiers. A voltage amplification type circuit configuration is illustrated, but the invention is not limited to this circuit configuration. A current amplification type amplifier etc. is also possible. This embodiment will be explained later.

Circuit Configuration of Modulator (MOD) 10B

First Mixer 15

The first mixer 15 for converting the I component BB signal S13 comprised of the current format differential signals +BB-I and −BB-I output from the V-I converter 13 to the current format RF-I component signal S15 has an NPN transistor 55 and NPN transistor 56 and an NPN transistor 57 and NPN transistor 58. The first mixer 15 is comprised as a Gilbert type multiplier. An emitter of the transistor 55 and an emitter of the transistor 56 are commonly connected at a node N11, the node N11 is connected to the collector of the transistor 51 forming the V-I converter 13, and a differential signal +BB-I is input. An emitter of the transistor 57 is commonly connected with an emitter of the transistor 58 at a node N12, the node N12 is connected to the collector of the transistor 52 forming the V-I converter 13, and a differential signal −BB-I is input. A base of the transistor 55 is connected at a node N14 to a base of the transistor 58, and the node N14 is supplied with a positive I component local oscillation signal +ILO-I. A base of the transistor 56 is connected at a node N13 with a base of the transistor 57, and the node N13 is supplied with a negative I component local oscillation signal −ILO-I. A collector of the transistor 56 is connected at a node N16 to a collector of the transistor 58, while a collector of the transistor 57 is connected at a node N15 to a collector of the transistor 55. A positive mixer output +Imix_I is output from the node N15, while a negative mixer output −Imix_I is output from the node N16. The positive mixer output +Imix_I and the negative mixer output −Imix_I form the current format RF-I component signal S15.

Second Mixer 16

The second mixer 16 for converting the Q component BB signal S14 comprised of the current format differential signals +BB-Q and −BB-Q to the current format RF-Q component signal S16 has an NPN transistor 59 and NPN transistor 60 and an NPN transistor 61 and NPN transistor 62. The second mixer 16 is also comprised of a Gilbert type multiplier. An emitter of the transistor 59 is connected at a node N21 with an emitter of the transistor 60, the node N21 is connected to a collector of a transistor 53 forming the V-I converter 14, and a signal +BB-Q is input. An emitter of the transistor 61 is connected at a node N21 with an emitter of the transistor 62, the node N12 is connected to a collector of the transistor 54 forming the V-I converter 14, and a signal −BB-Q is input. A base of the transistor 59 is connected at a node N24 to a base of the transistor 62, and the node N24 is supplied with a positive Q component local oscillation signal +ILO-Q. A base of the transistor 60 is connected at a node N23 to a base of the transistor 62, and a node N22 is supplied with a negative Q component local oscillation signal −ILO-Q. A collector of the transistor 60 is connected at a node N26 to a collector of the transistor 62, while a collector of the transistor 61 is connected at a node N25 to a collector of the transistor 59. A positive mixer output +Imix_Q is output from the node N25, while a negative mixer output −Imix_Q is output from the node N26. The positive mixer output +Imix_Q and the negative mixer output −Imix_Q form the current format RF-Q component signal S16.

RF Signal Combiner 17

The first mixer 15 and the second mixer 16 are configured as open collector circuits, so by connecting the collectors, an RF signal combiner 17 can be configured. That is, the RF signal combiner 17 is comprised of a node N17a and a node N17b. The node N17a is connected to the node N15 and the node N25, the current signals +Imix_I and +Imix_Q are combined (added) in current, and a positive RF modulated signal +Imod forming part of the current format RF signal S17 is output. The node N17b is connected to the node N16 and the node N26, the current signals −Imix_I and −Imix_Q are combined in current, and a negative RF modulated signal −Imod forming part of the current format RF signal S17 is output.

Gain Controlled Type Amplifier (GCA) 18

In this embodiment, the GCA 18 comprised as part of the modulator (MOD) 10B is, for example, comprised of two differential amplifiers 18A and 18B. The first differential amplifier 18A has two NPN transistors 65 and 66 and a load Z1. The second differential amplifier 18B has two NPN transistors 67 and 68 and a load Z1. Emitters of the transistors 65 and 66 are commonly connected at a node N31, the node N31 is connected to the node 17a of the RF signal combiner 17, and a positive RF modulated signal +Imod is input from the node N17a. Emitters of the transistors 67 and 68 are commonly connected at a node N35, the node N35 is connected to the node N17b of the RF signal combiner 17, and a negative RF modulated signal −Imod is input from the node N17b. A base of the transistor 65 and a base of the transistor 68 are commonly connected at the node N32, while a base of the transistor 66 and a base of the transistor 67 are commonly connected at a node N34. Between the node N32 and the node N34, differential control voltages +Vc and −Vc for controlling the gain of the GCA 18 are input. Between a collector of the transistor 65 and a supply line 100 for supplying the power Vcc, a load Z1 is connected. Similarly, between a collector of the transistor 68 and a supply line 100 for supplying a first reference power Vcc, a load Z1 is connected. A collector of the transistor 66 and a collector of the transistor 67 are directly connected to the supply line 100. A positive amplified signal +S18 is output from a node N33 to which the collector of the transistor 65 and the load Z1 (71) are connected, while a negative amplified signal −S18 is output from a node N36 to which the collector of the transistor 68 and the load Z1 (72) are connected. The amplified signal S18 is comprised of these differential amplified signals +S18 and −S18.

As explained above, the V-I converter 13 and V-I converter 14, the first mixer 15 and second mixer 16, and the GCA 18 are connected between the supply line 100 for supplying the power Vcc as the first reference potential and the ground as the second reference potential.

Operations of Voltage-Current (V-I) Conversion Unit 10A and Modulator (MOD) 10B

The operations of the V-I converter 13 and the first mixer 15 will be explained next. When the bases of the transistors 51 and 52 of the V-I converter 13 are supplied between them with the voltage format base band I component signal BB-I, the differential amplification circuit comprised of the transistors 51 and 52 and the constant current source I10 amplifies the signal BB-I, and the collectors of the transistors 51 and 52 output the current format differential base band signals +I_BB I and −I_BB I. The differential base band signals +I_BB I and −I_BB I form the I component BB signal S13 shown in FIG. 2. From the above, the voltage format base band in-phase I component signal BB-I is converted to current and is amplified in accordance with the degree of amplification of the differential amplification circuit comprised of the transistors 51 and 52 (note that the amplification degree =1 is also included). The positive +I-BB I signal is supplied to the common emitter part (node N11) of the transistors 55 and 56 forming the first mixer 15. The −I_BB I signal is supplied to the common emitter (node N12) of the transistors 57 and 58 forming the first mixer 15. In the first mixer 15, the node N14 to which the bases of the transistors 55 and 58 are commonly connected is supplied with a positive I component differential local oscillation signal +ILO-I, while the node N13 to which the bases of the transistors 56 and 57 are commonly connected is supplied with the negative I component differential local oscillation signal −ILO-I.

The operations of the first mixer 15 and second mixer 16 will be explained next. The signal components are set as follows.

Current converted BB signal component;
In-phase component: I_BB I=cos ωb,
Quadrature phase component: I_BB Q=sin ωb
Local oscillation signal component (LO component);
In-phase component: I_LOI=cos ωlo,
Quadrature phase component: I_LOQ=sin ωlo The current Imix_I and Imix_Q generated at the mixers 15 and 16 become as shown in the following equations:

$$Imix\_I = \cos\omega lo * \cos\omega b \quad (11)$$

$$Imix\_Q = -\sin\omega lo * \sin\omega b \quad (12)$$

The outputs of the collectors of the transistor 55 and the transistor 57 are added and the modulated signal +Imix-I is output. Similarly, the outputs of the collectors of the transistor 56 and the transistor 58 are added and the modulated signal −Imix-I is output. The mixer output current Imod becomes as shown in the following equation from equations (11) and (12):

$$Imod = (Imix\_I) + (Imix\_Q) \quad (13)$$
$$= \cos(\omega lo + \omega b)$$

As self evident from equation 13, the image signal component (cos(ωlo−ωb)) is removed. The modulated wave (signal) from which this image component has been removed is supplied to the GCA 18 cascade connected to the output parts of the mixers 15 and 16 and amplified.

The operations of the V-I converter 14 and the second mixer 16 are similar to the above. In the V-I converter 14 as well, like the V-I converter 13, when the bases of the transistors 53 and 54 are supplied between them with a voltage format base band Q component signal BB-Q, the signal BB-Q is amplified and the collectors of the transistors 53 and 54 output the current format differential base band signals +I-BB Q and −I-BB Q. The differential base band signals +I_BB Q and −I-BB Q form the Q component BB signal S14 shown in FIG. 2. As explained above, the voltage format base band Q component signal BB −Q is converted to current and is amplified in accordance with the degree of amplification of the differential amplification circuit comprised by the transistors 53 and 54 (note that including degree of amplification=1).

The Q signal is modulated in the same way as the modulation of the I signal. A VQ(Q) signal is supplied to the two bases of the transistors 53 and 54 and amplified and the current signals of +I_BB Q and −I_BB Q are output from the collectors. The +I_BB Q signal is supplied to a common emitter of the transistors 59 and 60 forming the mixer 16. The −I_BB Q signal is supplied to a common emitter of the transistors 61 and 62 forming the mixer 16, while the bases of the transistors 59 and 62 are supplied with the oscillation signal +LO_Q and the bases of the transistors 60 and 61 are supplied with the −LO_Q. The collector outputs of the transistor 59 and transistor 61 are added and the modulated signal +Imix_Q output. Similarly, the collector output of the transistor 60 and the transistor 62 are added and the modulated signal −Imix_Q is output.

At the node N17a of the RF signal combiner 17, the modulated signals +Imix_I and +Imix_Q are added whereby the +Imod RF modulated signal is obtained. At the node N17b, the modulated signals −Imix_I and −Imix_Q are added whereby the −Imod RF modulated signal is obtained. The modulated signals +Imod and −Imod are supplied to the GCA circuit 18.

In the GCA circuit 18, the differential control voltages +Vc and −Vc are changed to change the gain of the GCA 18, and gain controlled RF signals are taken out from the collector of the transistor 65 and the collector of the transistor 68. The GCA 18 may also be configured in its circuit by another embodiment as explained later with reference to FIG. 3 and FIG. 5.

As explained above, by combining the GCA 18 as part of the modulator (MOD) 10B, there is no need to convert the current format amplified signal S18 from the GCA 18 to voltage and the current signal can be input to the first GCA 19 in the RF-AGC processor 10C. As a result, the I-V conversion circuit for converting the voltage amplified signal S18 to current, the emitter follower circuit for shifting the level of the voltage, etc. become unnecessary. As a result, the consumed current can be reduced and the area on the semiconductor chip can be reduced. Further, the layout from the modulator (MOD) 10B to the RF-AGC processor 10C becomes easy. In addition, since the amplified signal S18 from the GCA 18 to the first GCA 19 is current, the problem of signal degradation due to the line capacitance between the GCA 18 and the first GCA 19 can be avoided and the frequency characteristics can be improved.

Figure 4:
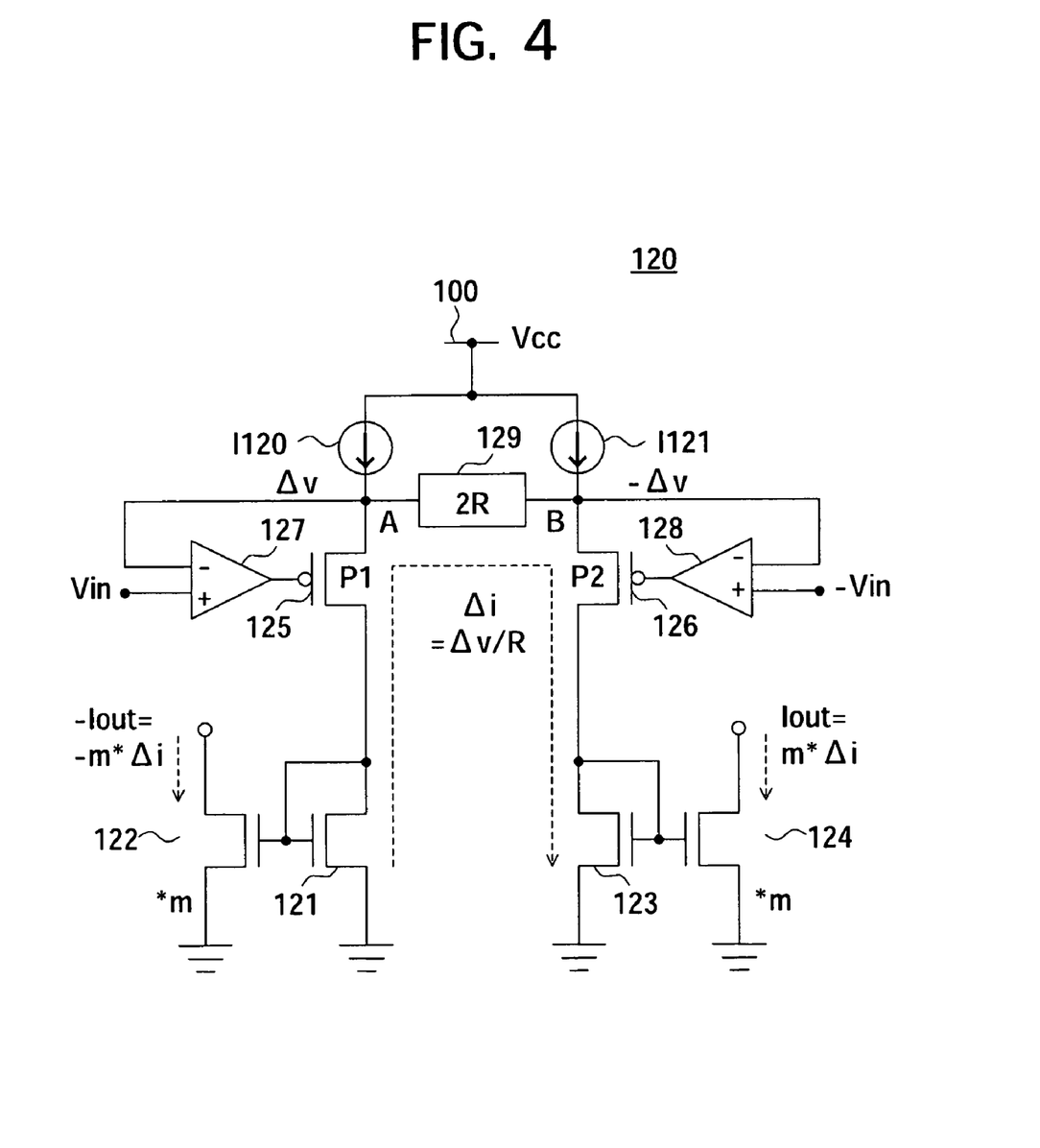
FIG. 4 is a view illustrating the circuit configuration of a V-I converter shown in FIG. 3.

In the gain control modulation circuit (GCA) 10 illustrated in FIG. 2, the example was shown of configuration by two differential amplifiers using bipolar transistors as the transistors forming the V-I converter 13 and the V-I converter 14 for converting the base band voltage signal to a current signal. However, the V-I converter 13 and V-I converter 14 for processing the base band signal may also be configured by using VI conversion circuits comprised of MOS transistors as shown in FIG. 4 other than using bipolar transistors. In this way, the V-I converter 13 and V-I converter 14 may use bipolar transistors, MOS transistors, and other transistors suitable for base band signal processing.

Second Embodiment

Figure 3:
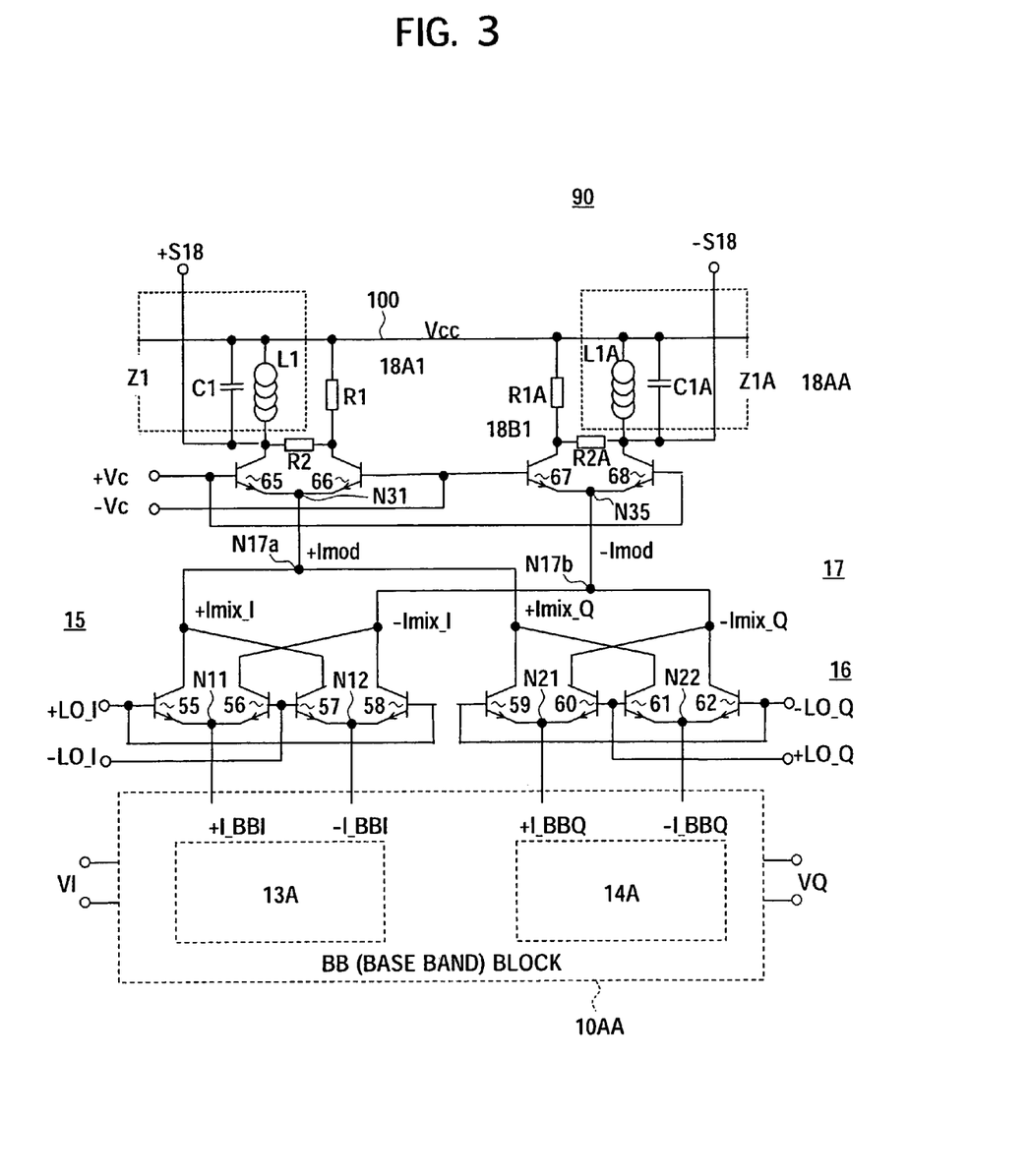
FIG. 3 is a view of an example of a circuit of a second embodiment of V-I conversion units and a modulator in a gain control modulation circuit shown in FIG. 1.

FIG. 3 is a view of an example of the circuit of a second embodiment of the voltage-to-current (V-I) conversion unit 10A and modulator (MOD) 10B in the gain controlled type modulation circuit (GCA) 10 shown in FIG. 1. In the circuit of FIG. 3, the first mixer 15, second mixer 16, and RF signal combiner 17 are the same as the circuits described with reference to FIG. 2. Therefore, the detailed explanations of the first mixer 15, second mixer 16, and RF signal combiner 17 will be omitted. In the circuit of FIG. 3, the voltage-to-current (V-I) conversion unit 10AA having the V-I converter 13A and the V-I converter 14A and the gain controlled type modulation circuit (GCA) 18AA having the first differential amplifier 18A1 and the second differential amplifier 18B1 differ in circuit configurations from the circuit configurations illustrated in FIG. 2.

In FIG. 3, the voltage-to-current (V-I) conversion unit 10AA corresponding to the voltage-to-current (V-I) conversion unit 10A shown in FIG. 2 has the V-I converter 13A and the V-I converter 14A. FIG. 4 is a view illustrating the circuit configurations of the V-I converter 13A and the V-I converter 14A shown in FIG. 3 as represented by the V-I converter 120. The V-I converter 120 is comprised of two VI conversion circuits, a PMOS transistor 125 and a PMOS transistor 126 comprise a differential amplifier, and a current conversion output signal is output from a first current mirror circuit comprised of NMOS transistors 121 and 122 and a second current mirror circuit comprised of NMOS transistors 123 and 124 in this circuit configuration. In the signal path into which a signal +Vin corresponding to a positive base band signal is input, one terminal of a constant current source I120 is connected to a supply line 100 of a reference power source Vcc, and the other terminal of the constant current source I120 is connected to a source of a transistor 125, an inverted input terminal (−) of a processor/amplifier 127, and one terminal of a resistor 129. The noninverted input terminal (+) of the processor/amplifier 127 is supplied with an input signal +Vin. The output signal of the processor/amplifier 127 is connected to the gate of the transistor 125. The drain of the transistor 125 is connected to the drain and gate of the source grounded transistor 121. The gate of the NMOS transistor 121 is connected to the gate of the source grounded type NMOS transistor 122 forming the current mirror circuit, and a signal converted from the current is output from the drain of the transistor 122. The ratio of area (ratio of gate widths) of the transistor 121 and the transistor 122 forming the current mirror circuit is set to 1:m, so current of m times the current flowing through the transistor 121 is output from a drain of the transistor 122. In the signal path into which the signal −Vin corresponding to the negative base band signal is input, one terminal of a constant current source I121 is connected to the supply line 100 of the reference power source Vcc, and the other terminal of the constant current source I121 is connected to a source of a PMOS transistor 126, an inverted input terminal (−) of a processor/amplifier 128, and the other terminal of a resistor 129. The noninverted input terminal (+) of the processor/amplifier 128 is supplied with the input signal −Vin. The output terminal of the processor/amplifier 128 is connected to the gate of the transistor 126. The drain of the transistor 126 is connected to the drain and gate of the source grounded transistor 123. The gate of the transistor 123 is connected to the gate of the source grounded transistor 124 forming the current mirror circuit, and a signal converted from the current is output from the drain of the transistor 124. The area ratio of the transistor 123 and the transistor 124 (ratio of gate widths) configuring the current mirror circuit is set to 1: m so that a current of m times the current flowing through the transistor 123 is output from a drain of the transistor 124.

The operation of the VI conversion circuit 120 will be explained next. The input voltage signal +Vin is compared at the input part of the processor/amplifier 127 with the voltage at the node (terminal) A, the differential voltage is supplied to the gates of the transistor 126 and the transistor 125 configuring the differential amplifier, and the current is adjusted so that the voltage of the node A of the source voltage becomes equal to the input voltage signal Vin for feedback. Similarly, the input voltage signal −Vin is compared at the input part of the processor/amplifier 128 with the voltage at the node (terminal) B, the differential voltage is supplied to the gate of the transistor 126, and the current is adjusted so that the voltage at the node B becomes equal to the input voltage signal −Vin for feedback. Further, the differential input voltages (+Vin and −Vin). are shifted in level and output to the nodes A and B of the processor/amplifiers 127 and 128. As a result, the voltage difference occurring between the nodes A and B is converted by the resistor 129 to current. This current, that is, the signal current (AC), flows through the transistor 126, transistor 123, ground, transistor 121, transistor 125, and resistor 129. The transistor 121 and the transistor 122 form a current mirror circuit, so a current m times the current flowing to the transistor 121 flows from the drain of the transistor 122. Similarly, a current m times the current flowing to the transistor 123 flows from the drain of the transistor 124.

If making the input signal Vin shown in FIG. 4 the base band I component signal BB −I shown in FIG. 3, the V-I converter 120 may be used as a V-I converter 13A. Similarly, if making the input signal Vin the base band Q component signal BB −Q, the V-I converter 120 may be used as a V-I converter 14A. In the V-I converter 13A of FIG. 3, the voltage signal Vin (VI) is input. As a result, the current converted signal (−I_BB I) output from the drain of the transistor 122 is supplied to the node N11 of the first mixer 15. Further, the current converted signal (+I_BB I) output from the drain of the transistor 124 is supplied to the node N12 of the first mixer 15. Similarly, in the V-I converter 14A, when the voltage signal Vin (VQ) is supplied, the current converted signal is supplied to the node N21 and the node N22 of the second mixer 16.

When using the VI conversion circuit 120 shown in FIG. 4, the drains of the current converted signal output transistors, that is, the NMOS transistors 122 and 124, are directly connected to elements forming the mixers 15 and 16, that is, the connection point of the emitters of the NPN transistors 55 and 56, the connection point of the emitters of the NPN transistors 56 and 58, the connection point of the emitters of the NPN transistors 59 and 60, and the connection point of the emitters of the NPN transistors 61 and 62. When connecting the circuit comprised of the V-I conversion unit 10AA, mixers 15 and 16, and gain control modulation circuit (GCA) 18AA between the first supply line 100 of the reference power Vcc and the second reference potential, that is, the ground (GND), the VI conversion circuit 120 requires only the voltage VDS between the drains and sources of the NMOS transistors 122 and 124. That voltage can be made small, the other voltage (Vcc−VDS) can be set by the mixers 15 and 16 and the gain control modulation circuit (GCA) 18AA, therefore the design margin of the circuit becomes greater. Along with this, the operating voltages of the mixer 15 and 16 or gain control modulation circuit (GCA) 18AA can be made larger, so there is the advantage that the linear region becomes broader.

The explanation of the operation of the mixers 15 and 16 is the same as that given above, so will be omitted. The explanation of the RF signal combiner 17 comprised of the node N17a and the node N17b will be omitted.

The gain control modulation circuit (GCA) 18AA illustrated in FIG. 3 will be explained first. The second embodiment is characterized in that the GCA 18AA is configured as part of the modulator 10B shown in FIG. 2. The first GCA 18A1 and second GCA 18B1 configuring the GCA 18AA are respectively comprised of differential amplifiers of the same circuit configurations. The first GCA 18A1 has NPN transistors 65 and 66 with emitters commonly connected at a node N31, a load Z1, a resistor R1, and a resistor R2. The load Z1 is comprised of a capacitor component C1 and an inductance component L1. The transistors 65 and 66 with commonly connected emitters and the load Z1 are similar in circuit configuration to the first differential amplifier 18A1 shown in FIG. 2, but differ in the resistor R1 and resistor R2. The second GCA 18B1 has transistors 67 and 68 with emitters commonly connected at a node N32, a load Z1A, a resistor R1A, and a resistor R2A. The load Z1A is comprised of a capacitor component C1A and an inductance component L1A. The NPN transistors 67 and 68 with commonly connected emitters are similar to those of the second differential amplifier 18B shown in FIG. 2, but the load Z1A, resistor R1A, and resistor R2A differ. The first GCA 18A1 and the second GCA 18B1 differ in the load Z1 and load Z1A, the resistor R1 and resistor R1A, and the resistor R2 and resistor R2A.

The positive modulated signal +Imod is supplied from the node N17a of the RF combination circuit 17 to a node N31 where the emitters of the transistor 65 and transistor 66 are commonly connected. The collector of the transistor 65 is connected through a load Z1 where the capacitor component C1 and the inductance component L1 are connected in parallel to the supply line 100 of the reference power Vcc and is connected to one terminal of the resistor R2. The output voltage +S18 is taken out from the collector of the transistor 65. The collector of the transistor 66 is connected through the resistor R1 to the supply line 100 of the reference power Vcc and is connected to the other terminal of the resistor R2. Similarly, the negative modulated signal −Imod is supplied to the node N35 where the emitters of the transistor 67 and the transistor 68 are connected in common. The collector of the transistor 68 is connected through a load Z1A to which the capacitor component C1A and the inductance component L1A are connected in parallel to the supply line 100 of the reference power Vcc and connected to one terminal of the resistor R2A. The output voltage −S18 is taken out from the collector of the transistor 68. The collector of the transistor 67 is connected through the resistor R1A to the supply line 100 of the reference power Vcc and connected to the other terminal of the resistor R2A. The load Z1 and the load Z1A form parallel resonance circuits with the capacitor component C1 and inductance component L1 and the capacitor component C1A and inductance component L1A, resonate in parallel at the desired frequency, for example, a frequency of 800 MHz by the load Z1 and 2 GHz by the load Z1A, act as band pass filters for taking out carriers (carrier signals), and take out these carriers from the output terminal of a gain control modulation circuit (GCA) 18AA.

Figure 5:
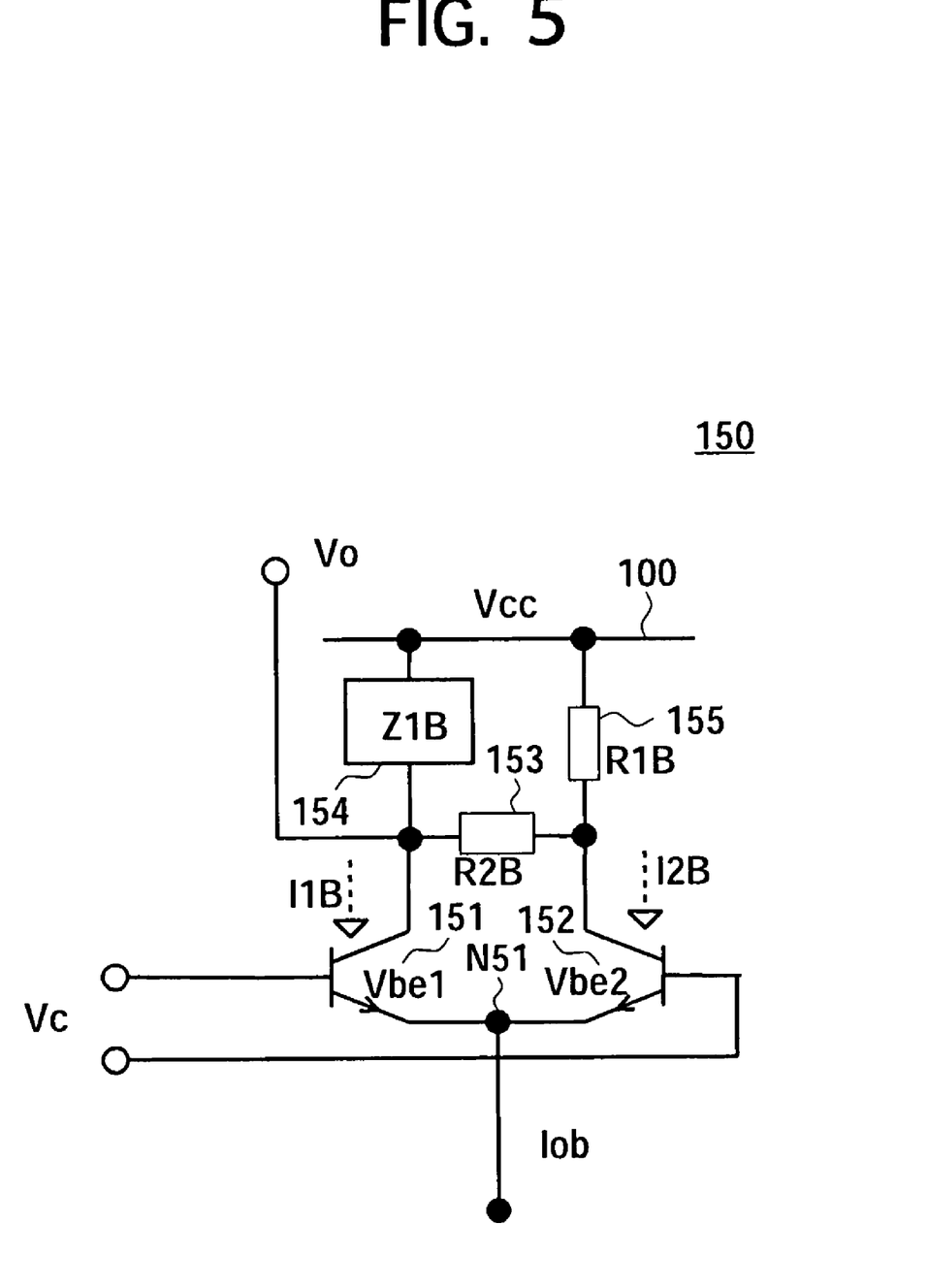
FIG. 5 is a circuit diagram for explaining the operation of the gain control modulation circuit shown in FIG. 4.

FIG. 5 is a view for explaining the operations of the first GCA 18A1 and second GCA 18B1 shown in FIG. 4. The circuit illustrated in FIG. 5 is illustrated as the GCA 150 as representative of the first GCA 18A1 and the second GCA 18B1. In the GCA 150, the output terminals of the signal current Iob output from the mixers 15 and 16 are connected to a node N51 to which the emitters of the NPN transistor 151 and the NPN transistor 152 corresponding to the NPN transistors 65 and 66 or the NPN transistors 67 and 68 are commonly connected, a collector of the NPN transistor 151 is connected through a load Z1B (154) corresponding to the loads Z1 and Z1A to the supply line 100 of the reference power Vcc and is connected to one terminal of the resistor R2B (153) corresponding to the resistors R2 and R2A. The output voltage is taken out from the collector of the transistor 151. The collector of the NPN transistor 152 is connected through a resistor R1B (155) to the power source Vcc and is connected to the other terminal of the resistor R2B (153). That is, the output circuit of the differential circuit has a pi (π) configuration and combines the differential outputs.

The circuit operation of the GCA circuit 150 will be explained next. The signal current is input from the common emitter of the transistors 151 and 152 and the control voltage Vc is changed, whereby the amount of attenuation of this signal current changes. In the GCA 150, the load circuit is comprised of Z1B and R2B and R1B, and an output signal Vo is derived from the collector of the transistor 151. The output signal Vo is expressed by the following equation:

$$Vo = \{Z1B // (R1B + R2B)\} \times I1B + \qquad (14)$$
$$\{(Z1B + R2B) // R1B \times Z1B/(Z1B + R2B)\} \times I2B$$
$$= Rmax \times Iob/[1 + \exp(-Vc/Vt)] + Rmin \times$$
$$Iob/[1 + \exp(Vc/Vt)]$$

where, $Rmax = Z1B \times (R1B + R2B)/(R1B + R2B + Z1B)$, $Rmin = Z1B \times R1B/(R1B + R2B + Z1B)$ $Vc = V_{BE1} - V_{BE2}$, $Vt$: Boltzmann constant If provisionally setting the input voltages as Vi=1 and Z1B=R1B=R2B=IoB=1 so as to facilitate understanding of the characteristics of the GCA 150, the gain G becomes a value shown by the following equation:

$$G = (\tfrac{2}{3})/[1+\exp(-Vc/Vt)] + (\tfrac{1}{3})/[1+\exp(Vc/Vt)] \qquad (15)$$

Figure 6:
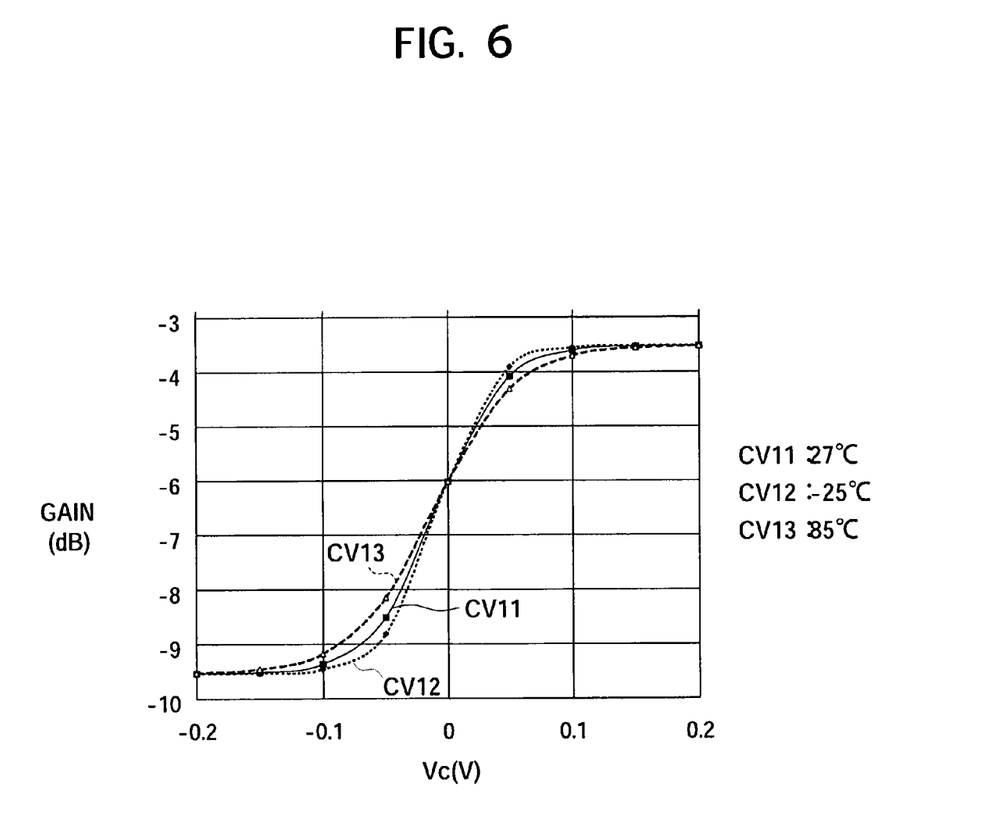
FIG. 6 is a graph showing the characteristics of equation (15) as the control voltage Vc and gain characteristics when changing the ambient temperature conditions.

FIG. 6 shows the characteristics of equation (15) as a control voltage Vc and gain characteristics on a graph when changing the ambient temperature conditions. The abscissa shows the control voltage Vc shown in 0.1V steps from −0.2V to +0.2V in range. Further, the ordinate shows the gain (G) in 1 dB steps from −3 dB to −10 dB in range. The gain was found when making the ambient temperature −25° C., 27° C., and 85° C. and changing the control voltage Vc. As clear from the results of FIG. 6, the range of gain control is controlled to a finite width by being limited by the maximum gain and minimum gain. Further, the control characteristics are substantially point symmetric about the center gain, in this example, −6 dB. Further, there is extremely small fluctuation in the characteristics at a temperature of −25° C. to +85° C. in range. In actuality, after the gain control modulation circuit (GCA) 18AA, a two-stage gain control modulation circuit comprised of the first GCA 19 and the second GCA 20 is placed in the RF-AGC processor 10C. These are made to overlap so as to cancel out the temperature characteristics and obtain good linearity and temperature characteristics.

Third Embodiment

Transmission Apparatus

Of course, the gain control modulation circuit (GCA) 10 illustrated in FIG. 1 showing the detailed circuit configuration as the first embodiment and second embodiment may be used instead of the modulation circuit 201 illustrated in FIG. 7 and combined with the SAW filter 205, power amplifier 206, and duplexer 207 to configure a communication (transmission) apparatus 200 for sending out a transmission signal from the antenna 208. Such a communication (transmission) apparatus 200 has the above-mentioned effects.

Note that as an embodiment of the present invention, a CDMA type gain control modulation circuit (converter) was explained, but the invention is not limited to this communication system. It is also effective for other systems able to use the present invention.

Fourth Embodiment

Reception Apparatus

Above, the explanation was given of a modulation circuit of the transmission system of a communication apparatus, but the invention should not be limited to this. It is clear that the gain control modulation circuit (GCA) of the first embodiment and second embodiment may also be applied to a demodulation circuit of the reception system of a communication apparatus, for example, a mixer circuit and its peripheral circuits. In this case, the demodulation circuit converts the high frequency signal to the base band signal, so the local oscillation frequency output from the local oscillation circuit comprised of the VCO 21 and the frequency divider 22 differs from the oscillation frequency used in the above-mentioned modulation circuit 201.

It should be understood by those skilled in the art that various modifications, combinations, sub-combinations, and alterations may occur depending on design requirements and other factors insofar as they are within the scope of the appended claims or the equivalents thereof.

What is claimed is:

1. A signal processing circuit comprising: a modulator; a first gain control circuit; and a second gain control circuit, wherein the modulator has a first frequency conversion circuit and a second frequency conversion circuit, wherein the first frequency conversion circuit and the second frequency conversion circuit each have a local oscillator for outputting a local oscillation signal, and wherein the first frequency conversion circuit and the second frequency conversion circuit each have a mixer for multiplying a signal having a first frequency and the local oscillation signal output by the local oscillator, thereby converting the first frequency of said first signal to a second frequency, wherein the first frequency conversion circuit outputs a first current frequency converted signal, and wherein the second frequency conversion circuit outputs a second current frequency converted signal, wherein the first current frequency converted signal and the second current frequency converted signal are in a current format, wherein an output signal of the modulator is not converted to voltage and an RF signal is transferred by current, thereby reducing consumed current, and wherein the first gain control circuit amplifies the first current frequency converted signal and the second current frequency converted signal by a first gain in accordance with a first control voltage and the first gain control circuit outputs a first current amplified signal and a second current amplified signal, and wherein the second gain control circuit is connected after said first gain control circuit and comprises at least one gain control circuit amplifying the first current amplified signal and the second current amplified signal output from said first gain control circuit by a second gain in accordance with a second control voltage and outputting the amplified signal, wherein the first gain control circuit and the second gain control circuit are made to overlap as to cancel out temperature characteristics and obtain linearity, and wherein a first input voltage signal is compared at an input part of a first amplifier with a voltage at a first terminal, a first differential voltage outputted from the first amplifier is supplied to gates of a first transistor and a second transistor, and the current is adjusted so that the voltage of the first terminal becomes equal to the first input voltage signal for feedback, and wherein a second input voltage signal is compared at the input part of a second amplifier with a voltage at a second terminal, a second differential voltage outputted from the second amplifier is supplied to a gate of the first transistor, and the current is adjusted so that the voltage at the second terminal becomes equal to the second input voltage signal for feedback, and wherein the first input voltage signal and the second input voltage signal are shifted in level and output to the first terminal and the second terminal of the first amplifier and the second amplifier, resulting in a voltage difference occurring between the first terminal and the second terminal, which is converted to a current signal.

2. The signal processing circuit as set forth in claim 1, wherein at a preceding stage of said mixers in said frequency conversion circuits, further comprising:

voltage-current conversion circuits converting a voltage signal having a first frequency to a current signal.

3. The signal processing circuit as set forth in claim 2, wherein said voltage-current conversion circuits have differential type amplification circuits.

4. The signal processing circuit as set forth in claim 3, wherein said voltage-current conversion circuits have circuits formed by two bipolar transistors connected as differential pairs and constant current sources connected to parts where emitters of said two bipolar transistors are connected, wherein said voltage input signals are supplied to bases of said two bipolar transistor, and wherein said current format converted signals are output from collectors of said bipolar transistors.

5. The signal processing circuit as set forth in claim 3, wherein said voltage-current conversion circuits, each has:

a first MOS transistor, a first constant current source connected to a drain or source of said first transistor, a first processor/amplifier connected to a gate of said first transistor, a first current mirror circuit connected to a source or drain of said first transistor and comprised of two MOS transistors, a second MOS transistor, a second constant current source connected to a drain or source of said second transistor, a first processor/amplifier connected to a gate of said second transistor, a second current mirror circuit connected to a source or drain of said first transistor and having two MOS transistors, and a feedback resistor between one terminal of said first processor/amplifier and another terminal of said second processor/amplifier, wherein said voltage format input signal being supplied between the other terminal of said first processor/amplifier and the other terminal of said second processor/amplifier, and wherein said current format converted signal being output from said first current mirror circuit and said second current mirror circuit.

6. The signal processing circuit as set forth in claim 1, wherein each of said mixers in said frequency conversion circuits has Gilbert type multiplication circuits.

7. The signal processing circuit as set forth in claim 1, wherein said first gain control circuit has a differential pair type amplification circuit amplifying a frequency converted signal of said Gilbert type multiplication circuit by a gain in accordance with said first control voltage.

8. The signal processing circuit as set forth in claim 7, wherein said first gain control circuit has a circuit in which two transistors are connected as a differential pair and a resonance circuit is connected between collectors of said two transistors and a reference power supply line, wherein a portion where the emitters of said two transistors are commonly connected is supplied from the current format frequency converted signal from said frequency conversion circuit, wherein the bases of said two transistors are supplied between the two transistors with said control voltage, and wherein a gain controlled amplified signal being output from the collectors of said two transistors.

9. A signal processing circuit as set forth in claim 7, wherein said first gain control circuit has a circuit formed by two transistors connected as a differential pair, a resonance circuit connected between a collector of one transistor of said two transistors and a reference power supply line, a first resistor connected between a collector of the other transistor of said two transistors and said reference power supply line, and a second resistor connected between the collectors of said two transistors, a portion where emitters of said two transistors are commonly connected being supplied with a current frequency converted signal from said frequency conversion circuit, bases of said two bipolar transistor being supplied between them with said control voltage, a gain controlled amplified signal being output from the collectors of said two transistors.

10. A signal processing circuit as set forth in claim 1, wherein said local oscillator outputs a local oscillation signal raising the frequency of a signal having the base band frequency to said mixer.

11. A signal processing circuit as set forth in claim 1, wherein said local oscillator outputs a local oscillation signal lowering the frequency of a signal having a high frequency to the base band to said mixer.

12. A signal processing circuit as set forth in claim 1, wherein said frequency conversion circuits having said local oscillators and said mixers are configured as circuits for processing orthogonal signals having an in-phase signal and quadrature phase signal, said first gain control circuit amplifies current frequency-converted orthogonal signals from said frequency conversion circuits by a first gain in accordance with said first control voltage and outputs current orthogonal amplified signals, and said second gain control circuit further amplifies the current orthogonal amplified signals output from said first gain control circuit.

13. A signal processing circuit as set forth in claim 12, wherein said voltage-current conversion circuits output voltage orthogonal signals having an in-phase signal and a quadrature phase signal as current signals having an in-phase signal and quadrature phase signal to said frequency conversion circuits.

14. A communication apparatus comprising a signal processing circuit as set forth in claim 1 as a transmission circuit or a reception circuit connected to an antenna.

* * * * *